US010020313B2

(12) United States Patent
Lee et al.

(10) Patent No.: US 10,020,313 B2
(45) Date of Patent: Jul. 10, 2018

(54) ANTIFUSE WITH BACKFILLED TERMINALS

(71) Applicant: INTEL CORPORATION, Santa Clara, CA (US)

(72) Inventors: Chen Guan Lee, Hillsboro, OR (US); Walid M. Hafez, Portland, OR (US); Chia Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/110,706

(22) PCT Filed: Feb. 11, 2014

(86) PCT No.: PCT/US2014/015673
§ 371 (c)(1),
(2) Date: Jul. 8, 2016

(87) PCT Pub. No.: WO2015/122870
PCT Pub. Date: Aug. 20, 2015

(65) Prior Publication Data
US 2016/0336332 A1    Nov. 17, 2016

(51) Int. Cl.
H01L 29/66    (2006.01)
H01L 29/78    (2006.01)
(Continued)

(52) U.S. Cl.
CPC .... H01L 27/11206 (2013.01); H01L 23/5252 (2013.01); H01L 27/0629 (2013.01); *H01L 2924/0002* (2013.01)

(58) Field of Classification Search
CPC .......... H01L 27/11206; H01L 23/5252; H01L 2924/0002; H01L 23/5256; H01L 27/0629;
(Continued)

(56) References Cited

U.S. PATENT DOCUMENTS 5,464,790 A    11/1995  Hawley
7,087,975 B2 *  8/2006  Lehmann ............ H01L 23/5252
                                          257/529
(Continued)

FOREIGN PATENT DOCUMENTS

KR    20100100398 A    9/2010
TW       201007824    2/2010
TW       201334119    8/2013

OTHER PUBLICATIONS

International Search Report and Written Opinion for International Patent Application No. PCT/US2014/015673, dated Nov. 10, 2014, 11 pages.
(Continued)

Primary Examiner — Marcos D Pizarro
Assistant Examiner — Nelson Garces
(74) Attorney, Agent, or Firm — Green, Howard & Mughal LLP

(57) ABSTRACT

An antifuse may include a non-planar conductive terminal having a high-z portion extending to a greater z-height than a low-z portion. A second conductive terminal is disposed over the low-z portion and separated from the first terminal by at least one intervening dielectric material. Fabrication of an antifuse may include forming a first opening in a first dielectric material disposed over a substrate, and undercutting a region of the first dielectric material. The undercut region of the first dielectric material is lined with a second dielectric material, such as gate dielectric material, through the first opening. A conductive first terminal material backfills the lined undercut region through the first opening. A second opening through the first dielectric material exposes the second dielectric material lining the undercut region. A conductive second terminal material is backfilled in the second opening.

16 Claims, 11 Drawing Sheets

(51) Int. Cl.
*H01L 27/112* (2006.01)
*H01L 23/525* (2006.01)
*H01L 27/06* (2006.01)

(58) Field of Classification Search
CPC ........... H01L 29/7813; H01L 29/66734; H01L 29/66704; H01L 21/28008; H01L 29/7835; H01L 21/76; H01L 29/404; H01L 29/407; H01L 29/7825; H01L 27/088; H01L 29/4236; H01L 29/66681; H01L 29/7823; H01L 29/0692; H01L 21/823456; H01L 21/823487; H01L 21/823481; H01L 29/0696; H01L 21/761; H01L 29/66659
USPC .................................................. 257/374–384
See application file for complete search history.

(56) References Cited

U.S. PATENT DOCUMENTS

| | | |
|---|---|---|
| 7,157,782 B1 | 1/2007 | Shih et al. |
| 9,123,801 B2 * | 9/2015 | Meiser .............. H01L 29/66734 |
| 2010/0224956 A1 | 9/2010 | Kim et al. |
| 2011/0080765 A1 | 4/2011 | Groepl et al. |
| 2012/0248567 A1 | 10/2012 | Hsu et al. |

OTHER PUBLICATIONS

International Preliminary Report on Patentability for PCT/US2014/015673 dated Aug. 25, 2016, 7 pages.
Office Action and Search Report for Taiwan Patent Application No. 104100266 dated Aug. 17, 2016, 12 pages.

* cited by examiner

ANTIFUSE WITH BACKFILLED TERMINALS

CLAIM OF PRIORITY

This application is a National Phase Application of, and claims priority to, PCT Application No. PCT/US14/15673, filed on 11 Feb. 2014, titled "ANTIFUSE WITH BACK-FILLED TERMINALS", which is incorporated by reference in its entirety for all purposes.

TECHNICAL FIELD

Embodiments described herein generally relate to integrated circuits (ICs) and monolithic devices, and more particularly pertain to a monolithic antifuse.

BACKGROUND

Monolithic ICs generally comprise a number of transistors, such as metal-oxide-semiconductor field-effect transistors (MOSFETs) fabricated over a planar substrate, such as a silicon wafer.

ICs often include at least one antifuse. An antifuse is an electrical device that starts with a high resistance and is designed to permanently create a conductive path when the voltage across the device exceeds a threshold level. With transistor dimension scaling from one generation to another, it is advantageous to scale down the antifuse bit cell size, as well as the antifuse program voltage.

Conventional antifuse designs often employ a MOS transistor-based structure, as depicted in FIG. 1. Antifuse 101 employs a transistor gate terminal 130 and a source/drain contacts 141, 142. As such, the antifuse circuit path passes through a gate dielectric 120, a doped semiconductor well 108, and heavily doped semiconductor source/drain 110. Formation of the conductive path during a programming operation entails permanently breaking down the gate dielectric 120, changing the resistance between gate terminal 130 and source/drain contacts 141, 142. Current levels in the antifuse post-breakdown are then limited to the conductive state resistance. For antifuse 101, the resistance in the conductive state includes the resistance of the intervening semiconductor regions 108, 110 and associated metal-semiconductor contact, which results in a limited On/Off antifuse ratio. Furthermore, conventional antifuse designs that utilize a breakdown of a transistor structure require a bit cell area sufficient to host both the MOS transistor-based antifuse and at least one other MOS transistor used for programming the antifuse.

Antifuse architectures and associated fabrication techniques with lower conductive state resistance, and/or smaller bit cell areas are advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
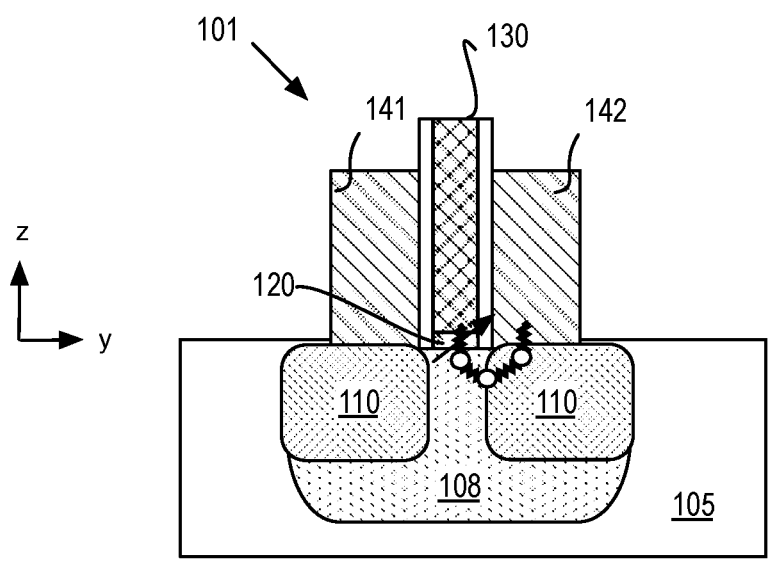
FIG. 1 is a conventional monolithic antifuse.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example up, down, top, bottom, and so on, may be used merely to facilitate the description of features in the drawings. Terms such as "upper" and "lower" "above" and "below" may be understood by reference to illustrated X-Z coordinates, and terms such as "adjacent" may be understood by reference to X,Y coordinates or to non-Z coordinates. Relative positional terms are employed herein merely as labels distinguishing one structural feature from another in a manner that may be more clear than enumerative labels, such as "first," "second," "third," etc.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material layer disposed over or under another may be directly in contact or may have one or more intervening material layers. Moreover, one material disposed between two materials or material layers may be directly in contact with the two layers or may have one or more intervening layers. In contrast, a first material or material layer "on" a second material or material layer is in direct contact with that second material/material layer. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Techniques and structures for a monolithic antifuse using a metal-insulator-metal (MIM) capacitor stack are described. Antifuse structures in accordance with embodiments employ a conductive material at both anode and cathode terminals with no intervening semiconductor. Dielectric breakdown is employed for antifuse programming with voltage applied across dielectric material separating the antifuse terminals inducing a short between the two terminals. Some benefits of embodiments described herein include lower program voltage, higher on/off ratio and smaller bit cell size relative to antifuse architectures that are based on MOS capacitors and/or MOS transistors. In advantageous embodiments, antifuse fabrication is compatible with a high-K gate dielectric, metal gate MOS transistor fabrication flow.

In an embodiment, a monolithic antifuse includes a non-planar conductive terminal disposed over a substrate. The non-planar terminal has a high-z portion extending to a greater z-height from the substrate than a low-z portion. A first ("lower,") dielectric material wraps around at least one sidewall of the low-z portion. A second ("upper") dielectric material is disposed over the first dielectric material and the low-z portion. A second conductive terminal is disposed over the low-z portion, extends through a least a partial thickness of the second dielectric material, and is separated from the first terminal by at least a partial thickness of the first dielectric material.

Figure 2A:
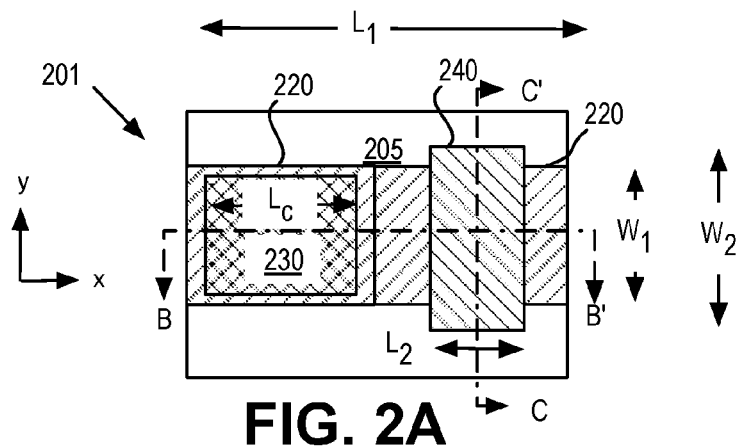
FIG. 2A is a plan view of a monolithic antifuse, in accordance with an embodiment.
Figure 2B:
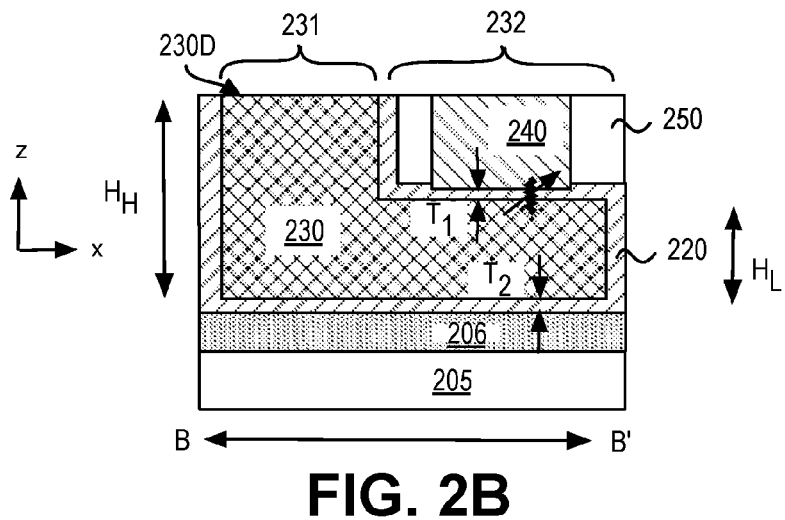
FIGS. 2B and 2C are a cross-sectional views of the antifuse illustrated in FIG. 2A, in accordance with embodiments.
Figure 2C:
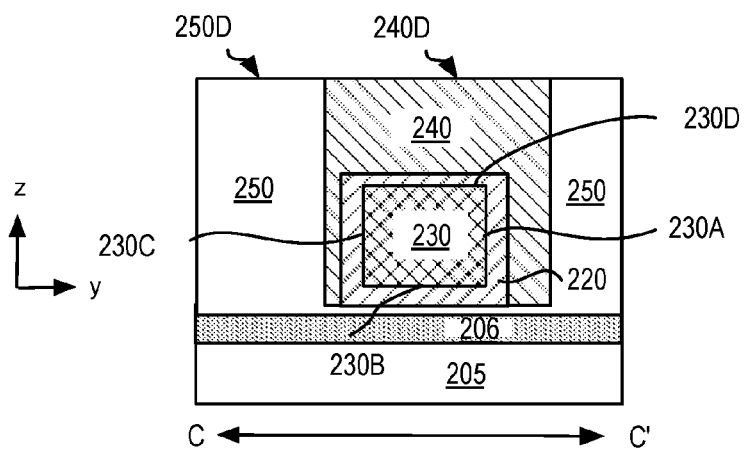

FIG. 2A is a plan view of a monolithic antifuse 201, in accordance with one such embodiment. FIG. 2B is a cross-sectional view of the antifuse 201 along the longitudinal B-B' line illustrated in FIG. 2A, in accordance with an embodiment. FIG. 2C is a cross-sectional view of the antifuse 201 along the transverse C-C' line illustrated in FIG. 2A, in accordance with an embodiment. Reference numbers are the same in FIGS. 2A-2C as the figures represent different views of the same structural embodiment.

As shown in FIG. 2A, an area of a substrate 205 is covered by antifuse terminal 230. Substrate 205 may be any substrate suitable for forming an IC, such as, but not limited to, a semiconductor substrate, semiconductor-on-insulator (SOI) substrate, or an insulator substrate (e.g., sapphire), the like, and/or combinations thereof. In one exemplary embodiment, substrate 205 comprises a substantially monocrystalline semiconductor, such as, but not limited to, silicon. Exemplary semiconductor compositions also include group IV systems, such as silicon, germanium, or an alloy thereof; group III-V systems, such as GaAs, InP, InGaAs, and the like; or group III-N systems, such as GaN. As further illustrated in FIG. 2B, substrate 205 may include an isolation dielectric material 206 within the area occupied by antifuse terminal 230. Dielectric material 206 may be any material, such as silicon dioxide or silicon nitride, of a thickness sufficient to electrically isolate the antifuse from a well ground and/or prevent electrical shorts through substrate 205.

Antifuse terminal 230 may be any conductive material, such as, but not limited, to metals and low resistance semiconductors. Low resistance semiconductors include polycrystalline silicon, doped polycrystalline silicon, polycrystalline germanium, doped polycrystalline germanium, polycrystalline silicon-germanium, or doped polycrystalline silicon-germanium. In advantageous embodiments, terminal 230 includes one or more metal, such as, but not limited to, tungsten, nickel, cobalt, aluminum, and titanium. For such metal embodiments, terminal 230 may be substantially one metal with only trace impurities, or may include a laminate stack structure or compositional grading of a plurality of metals, or may be a homogenous alloy of such metals, or a laminate or grading of alloyed metals, etc. In alloyed metal embodiments, one or more of metal-nitrides, metal-carbides, metal-silicides, and metal-germanides may be employed in terminal 230.

Terminal 230 has a longitudinal length $L_1$ and a transverse width $W_1$. Length $L_1$ may vary as needed for providing a contact land of length $L_C$, and to further accommodate the overlapping (e.g., in x-dimension) of a second antifuse terminal 240 having a length $L_2$. As such, antifuse terminal length $L_1$ is a function of manufacturing capability with respect to minimum contact dimensions. Antifuse terminal length $L_1$ is also a function of the desired antifuse terminal capacitor area, as described further below. Following the below functional guidelines, terminal 230 may have a length $L_1$ of anywhere between a minimum design rule (e.g., 0.1 µm, or less) to 5-10 µm, or more. Similarly, terminal 230 may have a width $W_1$ of anywhere between a minimum design rule (e.g., 10 nm, or less) up through a dimension of 150 nm, or more, typical of power supply lines.

As shown in FIG. 2B, terminal 230 is non-planar with the terminal length $L_1$ including both a high-z portion 231 and a low-z portion 232. A high-z portion 231 extends to a greater z-height ($H_H$) from substrate 205 than does a low-z portion 232 ($H_L$). The relative lengths of high-z and low-z portions, 231, 232 may vary with high-z portion 231 being sufficient to provide a contact land length $L_C$ as shown FIG. 2A. Low-z portion 232 may have a length sufficient to provide desired overlap with antifuse contact 240. In exemplary embodiments, terminal 230 has a high-z height between 50 nm and 200 nm, advantageously between 50 nm and 150 nm, and more advantageously no more than 100 nm. Low-z height $H_L$ is less than high-z height $H_H$ by anywhere between 10-90% of $H_H$. In one such embodiment, $H_L$ is at least 10 nm, advantageously between 20 nm and 90 nm.

As shown in FIGS. 2A, 2B, and 2C, dielectric material 220 wraps completely around low-z portion 232. Dielectric material 220 is disposed between substrate 205 and a bottom surface 230B of terminal 230. In the exemplary embodiment where substrate 205 is a crystalline semiconductor, terminal 230 is separated from the crystalline semiconductor by only the dielectric material 220 an isolation dielectric 206 embedded into the crystalline semiconductor. Dielectric material 220 is further disposed adjacent to terminal sidewalls 230A and 230B, in addition to being disposed on top surface 230D of low-z portion 232. Dielectric material 220 may comprise one or more dielectric materials, either in the form of a homogenous composition or as a laminate film stack and/or graded composition. In embodiments, dielectric material 220 includes silicon dioxide, and/or silicon nitride, and/or silicon oxynitride, and/or a higher-K material that has a bulk relative dielectric constant above silicon nitride (e.g., at least 10). In advantageous high-K embodiments, dielectric material 220 includes a metal oxide, such as $HfO_2$, $TiO_2$, $ZnO_2$, or the like.

In embodiments, a second antifuse terminal 240 overlaps a portion of terminal 230. As shown in FIG. 2B, terminal 240 is separated from terminal 230 by at least a partial thickness of dielectric material 220. In advantageous embodiments, all that is separating terminals 230 and 240 is dielectric material 220 (i.e., no other intervening material). Because antifuse programming proceeds by one or more dielectric breakdown mechanism (illustrated as the variable resistor between terminals 230 and 240), programming voltage is a function of the thickness of dielectric material 220 between the terminals in addition to being dependent on antifuse capacitor area as describe below. Reducing thickness of dielectric material 220 may lower antifuse programming voltages. In exemplary embodiments, dielectric material 220 has a $T_1$ layer thickness between terminals 230 and 240 that is below 10 nm equivalent oxide thickness (EOT). In an advantageous embodiment where dielectric material 220 is a high-k dielectric material having a bulk relative dielectric constant of at least 10, $T_1$ has physical thickness less than 10 nm. In further embodiments, the $T_1$ thickness of dielectric material 220 between terminals 230 and 240 is less than a $T_2$ thickness of dielectric material 220 in regions beyond the bounds of terminal 240. $T_1$ thickness may be selectively reduced relative to $T_2$ as another means of engineering (e.g., lowering) antifuse programming voltage.

Second antifuse terminal 240 is disposed over first terminal low-z portion 232. Antifuse terminal 240 may be any of the materials described for terminal 230. In an advantageous embodiment, terminal 240 is a metal such as, but not limited to tungsten, nickel, cobalt, aluminum, and titanium, and nitrides, silicides, carbides, and germanides thereof. In one exemplary embodiment where terminals 230 and 240 are both metal, terminal 240 is a different metal than terminal 230. Terminal 230, dielectric material 220, and terminal 240 form a MIM capacitor stack. In embodiments, antifuse-programming voltage is a function of the MIM capacitor area at least in part because defects within dielectric material 220 participate in dielectric breakdown mechanism(s) induced by application of a programming voltage across terminals 230, 240. Increasing the area of the antifuse capacitor may lower the antifuse program voltage for a dielectric of a given quality and thickness because the number of defects present within the antifuse capacitor scales with area of dielectric material 220 across which an electric field is applied. As such, antifuse program voltage may be engineered by increasing the overlap area between terminals 230 and 240. As shown in FIG. 2A, lithographic patterning may define antifuse capacitor area at least in part through the lateral dimensioning of antifuse terminal 240 (second terminal length $L_2$ and transverse width $W_2$), as well as the dimensioning of first terminal width $W_1$ where $W_2$ is larger than $W_1$. This capability enables a plurality of antifuses over a same substrate to have different predetermined programming voltages. As further shown in FIG. 2C, antifuse capacitor area associated with terminals 230, 240 may also be a function of a z-height of terminal 230 (e.g., $H_L$) in embodiments where terminal 240 wraps around at least one sidewall of terminal 230 (e.g., terminal sidewall 230A). In exemplary embodiments, terminal 240 is a filled via having a larger diameter than transverse width $W_1$ such that terminal 240 wraps around at least both terminal sidewalls 230A and 230C, increasing the antifuse capacitor area by approximately twice the product of low-z height $H_L$ and second terminal width $L_2$.

In embodiments, a second ("upper") dielectric material 250 is also disposed over low-z portion 232. Dielectric material 250 planarizes terminals 230, 240 and may further electrically isolate terminal 240 from terminal 230. Spacing between terminal 230 and 240 is not critical for antifuse functionality. Like a MOS device where a metal contact may be right next to a metal gate separated only by a dielectric spacer, terminals 230, 240 may be separated by only a dielectric spacer. With minimal spacing between terminals 230, 240, the overlap area between the two terminals is larger and may have benefit of lower program voltage. Terminal 240 extends vertically (e.g., in z-dimension) through at least a portion of dielectric material 250. Where terminal 240 does not extend through the entire thickness of dielectric material 250 and fails to expose dielectric material 220, antifuse program voltage can be expected to be higher as a function of greater total dielectric thickness. The non-planarity of terminal 230 enables the top surface of terminal 230 within high-z portion 231 (top surface 230D in FIG. 2B) to be planar with a top surface of terminal 240 (top surface 240D in FIG. 2C). This planarity in top surfaces of the antifuse terminals is advantageous for subsequent interconnection to other circuitry integrated onto substrate 205. Dielectric material 250 also has a top surface 250D that is planar with top terminal surfaces 230D and 240D. Dielectric material 250 may have any dielectric material composition, as embodiments are not limited in this respect. For example silicon dioxide, silicon nitride, carbon-doped silicon dioxide, and other porous low-k materials are all suitable for dielectric material 250. Although for advantageous embodiments dielectric material 250 has a bulk relative dielectric constant below that of dielectric material 220, higher-k materials may also be utilized for dielectric material 250.

Figure 3A:
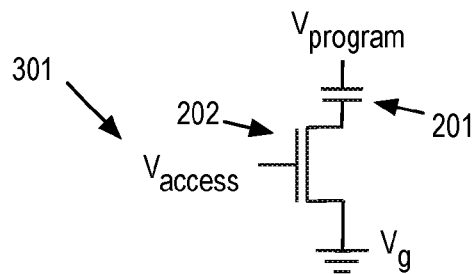
FIG. 3A is an antifuse bit cell circuit schematic, in accordance with an embodiment.

Further discussion of antifuse architecture is provided in the context of an antifuse bit cell that employs an antifuse having architecture in conformance with one or more of the embodiments described above. FIG. 3A is a circuit schematic of an antifuse bit cell 301, in accordance with one exemplary embodiment utilizing antifuse 201 substantially as described above. During bit-cell operation, a program voltage is to be applied to a first terminal (e.g., anode) of antifuse 201. A second terminal (e.g., cathode) of antifuse 201 is coupled to ground through a MOS pull-down transistor 202. More specifically, the second terminal of antifuse 201 is coupled to a first source/drain of transistor 202 while a second source/drain of transistor 202 is coupled to ground. Hence, upon application of an access voltage to a gate of transistor 202, the program voltage is dropped across terminals of antifuse 201, inducing dielectric breakdown in response to a high electric field.

Figure 3B:
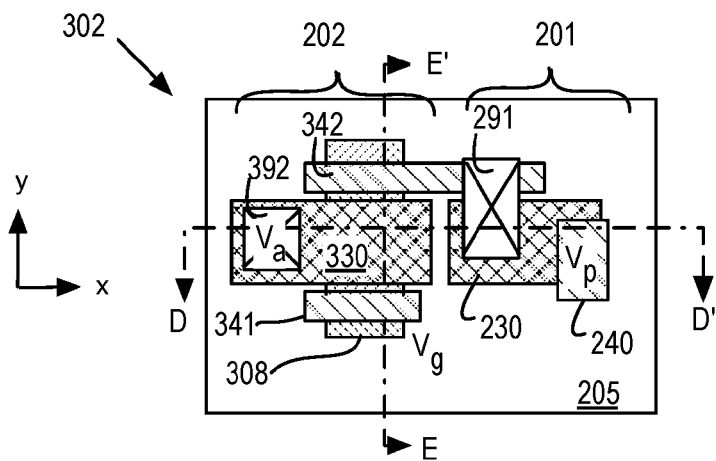
FIGS. 3B and 3C are plan views of an antifuse bit cell layout, in accordance with embodiments.
Figure 3C:
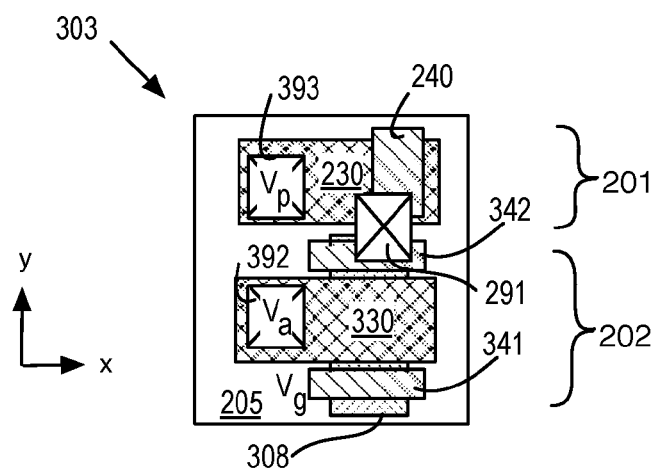

FIG. 3B is plan view of an exemplary antifuse bit cell layout 302 implementing the circuit illustrated in FIG. 3A, in accordance with an embodiment. FIG. 3C is plan view of a second exemplary antifuse bit cell 303 layout implementing the circuit illustrated in FIG. 3A, in accordance with an alternate embodiment. Common to both illustrated embodiments, each monolithic antifuse bit cell includes both an antifuse 201 and a MOS transistor 202 disposed over substrate 205 (e.g., semiconductor). MOS transistor 202 includes a gate terminal 330 patterned into a first stripe disposed over a first region of substrate 205 with a gate dielectric disposed there between. Antifuse 201 includes a first terminal 230 patterned into a second stripe disposed over a second region of substrate 205 adjacent to the first stripe. In advantageous embodiments, first antifuse terminal 230 includes the same material(s) as gate terminal 330. A second antifuse terminal 240 is disposed over a portion of antifuse terminal 230 with an intervening dielectric disposed there between substantially as described above. In advantageous embodiments, the intervening dielectric includes at least a partial thickness of the same material(s) utilized for the gate dielectric in MOS transistor 202.

As further illustrated in FIGS. 3B and 3C, MOS transistor 202 is disposed over a doped semiconductor well 308 with first and second source/drain contacts 341, 342 disposed on opposite sides of gate terminal 330. MOS transistor 202 is coupled to antifuse terminals to control a voltage level between the antifuse terminals. In bit cell 302, source/drain contact 342 is coupled to first antifuse terminal 230, for example through interconnect 291. An access voltage applied to gate terminal 330, for example through interconnect 392, turns transistor 202 "on," pulling antifuse terminal 230 to a first reference voltage (e.g., ground) coupled through source/drain 341. With transistor 202 in "on" state, a programming voltage applied to antifuse terminal 240 is dropped across antifuse 201. In bit cell 303, source/drain contact 342 is coupled to antifuse terminal 240, for example through interconnect 291. An access voltage applied to gate terminal 330, for example through interconnect 392, turns transistor 202 "on," which pulls antifuse terminal 240 to a first reference voltage (e.g., ground) coupled to source/drain contact 341. While transistor 202 is in an "on" state, a programming voltage applied to antifuse terminal 393 is dropped across antifuse 201.

Figure 3D:
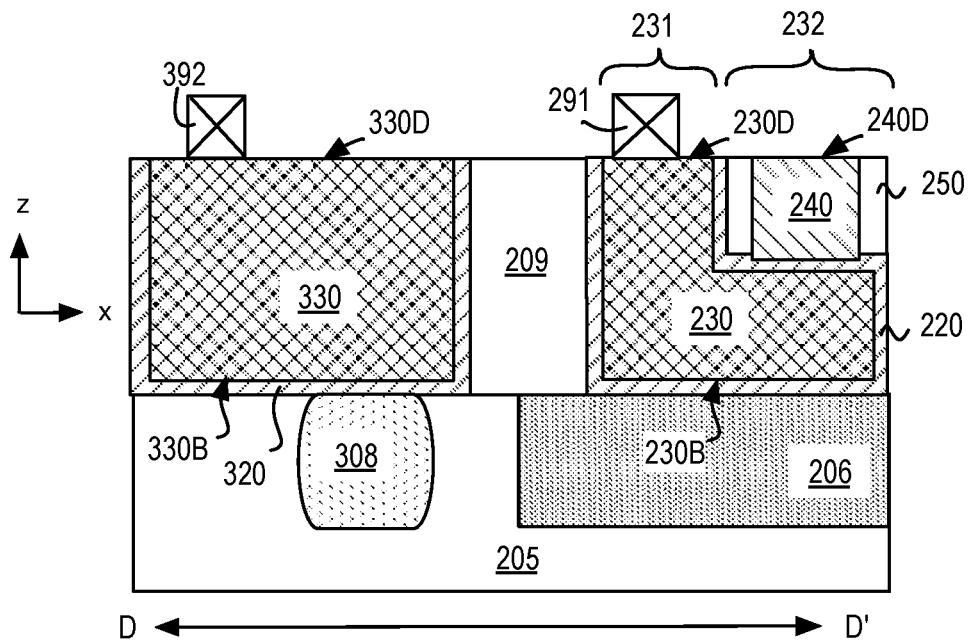
FIGS. 3D and 3E are cross-sectional views of the antifuse bit cell layout illustrated in FIG. 3B, in accordance with embodiments.
Figure 3E:
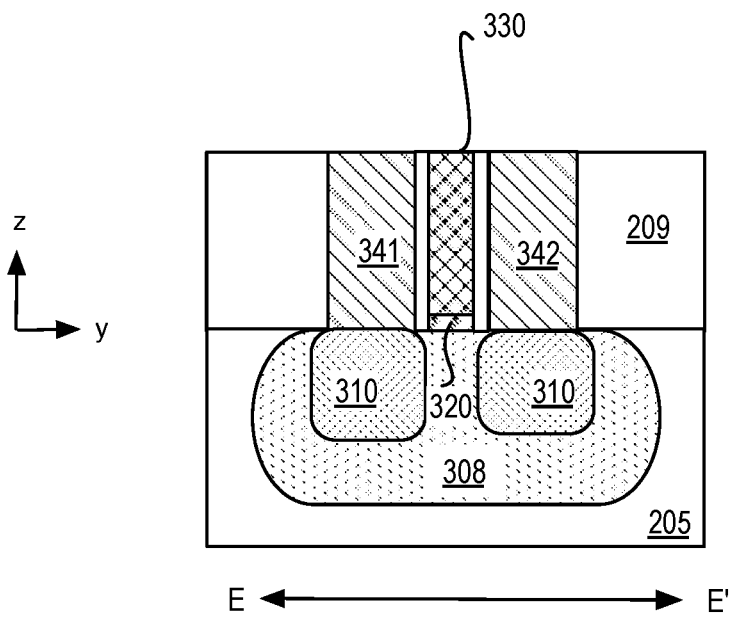

FIG. 3D is a cross-sectional view of antifuse bit cell 302, along the longitudinal D-D' line illustrated in FIG. 3B, in accordance with an embodiment. FIG. 3E is a cross-sectional view of antifuse bit cell 302, along the transverse E-E' line illustrated in FIG. 3B, in accordance with an embodiment. Similar structural features are also present in antifuse bit cell 303.

Referring first to FIG. 3D, antifuse terminal 230 includes high-z portion 231 with a top surface 230D that is planar with a top gate terminal surface 330D. Hence antifuse terminal 230 is a stripe having both a thick end with a z-thickness equal to that of gate terminal 330, and a thin end with a z-thickness less than that of gate terminal 330. In embodiments, antifuse terminal 230 and gate terminal 330 are of the same metal(s). Antifuse terminal 230 and gate terminal 330 are laterally separated by a surrounding dielectric 209.

Disposed between the first region of substrate 205 and gate terminal 330 is a gate dielectric material 320. Antifuse terminal 230 further includes low-z portion 232 with dielectric material 220 wrapping completely around at least the low-z portion and separating antifuse terminal 230 from the substrate (e.g., substrate isolation region 206). In advantageous embodiments where dielectric material 220 and gate dielectric 320 are the same material(s), gate terminal 330 has a bottom surface 330B substantially planar with a bottom surface of antifuse terminal 230B. In the exemplary embodiment, dielectric material 220 additionally functions as the MIM dielectric for antifuse 201, having a first interface with antifuse terminal 230 and a second interface with antifuse terminal 240. Between antifuse terminals 230, 240, dielectric material 220 may be thinner than gate dielectric material 320. In one embodiment, dielectric materials 220 and 320 both include a high-k dielectric material having a bulk relative dielectric constant greater than 9, and advantageously at least 10.

In embodiments, dielectric material 250 is disposed over dielectric material 220 and the low-z portion 232 as previously described. Where gate terminal 330 is substantially planar, no such dielectric region may be present over the top gate terminal surface 330D. In advantageous embodiments, antifuse terminal 240 extends completely through dielectric material 250 to contact dielectric material 220 over the thin end of antifuse terminal 230. Antifuse terminal 240 has a top surface 240D that is planar with top gate terminal surface 330D.

As further illustrated in FIG. 3E, transistor 202 includes source/drain contacts 341, 342 disposed over heavily doped source/drain semiconductor regions 310, which may be disposed in one or more lightly doped wells 308. In the exemplary embodiment, antifuse terminal 240 and MOS transistor source/drain contact 341 and/or 342 are the same material(s). Thus, antifuse terminal 240 may be any material(s) suitable for a MOS contact metallization, such as, but not limited to, tungsten, nickel, cobalt, aluminum, and titanium, alloys thereof, nitrides thereof, carbides, thereof, and silicides thereof.

Figure 4A:
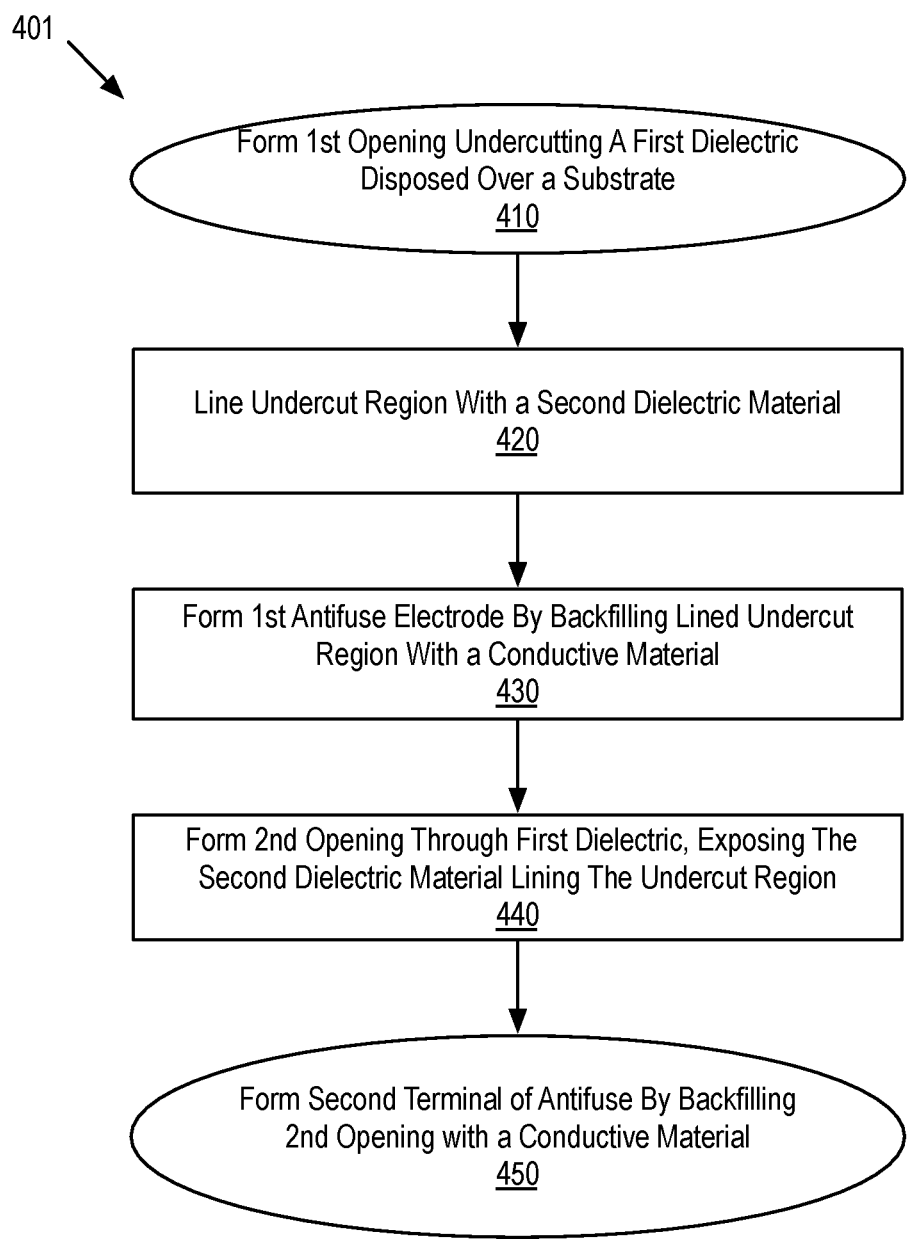
FIG. 4A is a flow diagram illustrating a method of forming an antifuse, in accordance with an embodiment.

The antifuse and antifuse bit cells described above may be fabricated with a wide variety of techniques. FIG. 4A is a flow diagram illustrating an exemplary method 401 for forming an antifuse in accordance with one embodiment. Method 401 begins with operation 410 where a first opening is formed in a first ("upper") dielectric layer. The opening laterally undercuts or undermines a portion of the first dielectric layer disposed over a substrate. An isotropic etch process having high selectivity between the first dielectric layer and another material may be utilized at operation 410, for example as described further below. At operation 420, the undercut region of the first dielectric layer is lined with a second ("lower") dielectric material (e.g., a transistor gate dielectric material). Deposition of this second dielectric may be through at least the first opening. A conformal deposition process, such as chemical vapor deposition (CVD) or atomic layer deposition (ALD), may be practiced at operation 420. At operation 430, a first terminal of the antifuse is formed by backfilling the lined undercut region with a conductive material, for example again through the first opening. A conformal deposition process such as CVD, or ALD, may be practiced at operation 430 to backfill the undercut region with any of the materials described above for terminal 230 (e.g., a MOS transistor gate metal). Method 401 then proceeds to operation 440 where a second opening is formed through the first dielectric. The second opening advantageously exposes the underlying second dielectric material lining the undercut region. Any dielectric etch process may be utilized at operation 440. The etch process advantageously stops on the second dielectric material lining the undercut region. Method 401 then completes with formation of a second antifuse terminal by backfilling the second opening with another conductive material (e.g., a MOS transistor contact metallization). Conventional fabrication may follow method 401 to complete interconnection of the antifuse terminals.

Figure 4B:
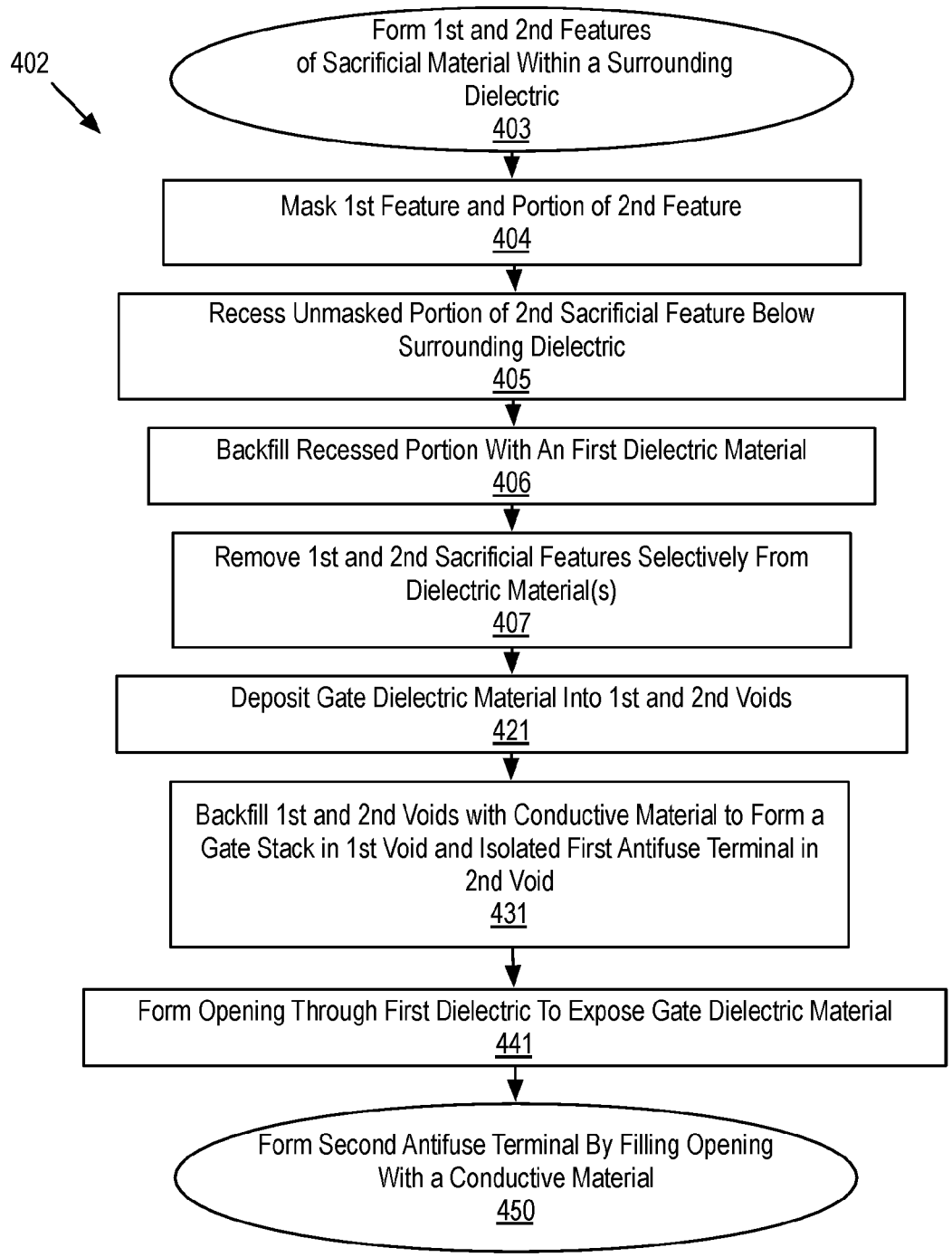
FIG. 4B is a flow diagram illustrating a method of forming an antifuse bit cell, in accordance with an embodiment.

FIG. 4B is a flow diagram illustrating a method 402 for forming an antifuse bit cell, in accordance with an embodiment. Method 402 may be considered a specific embodiment of the more general method 401. FIGS. 5A, 5B, 5C, 5D, 5E, 5F, and 5G are cross-sectional views of an evolving antifuse bit cell along the D-D' line depicted in FIG. 3B as selected operations in the method 402 are performed in accordance with an embodiment.

Figure 5A:
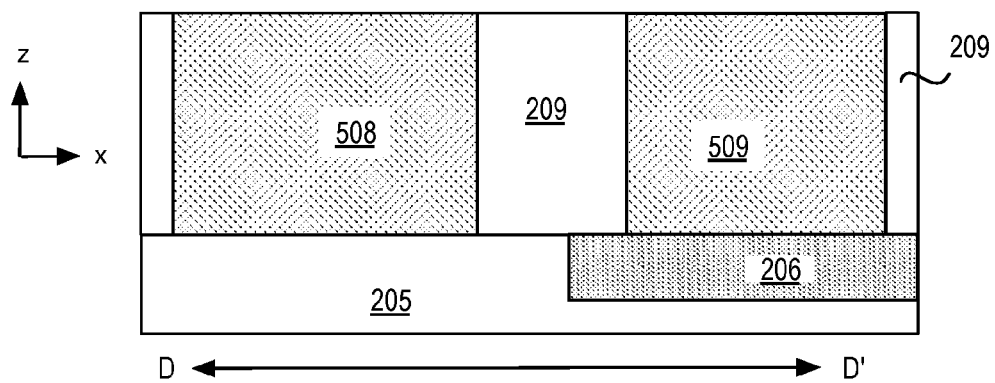
FIGS. 5A, 5B, 5C, 5D, 5E, 5F, and 5G are cross-sectional views of an antifuse bit cell evolving as selected operations in the method depicted in FIG. 4B are performed, in accordance with an embodiment.

Referring first to FIG. 4B, operations 403, 404, 405, 406 and 407 are performed as one specific embodiment of operation 410 of method 401 (FIG. 4A) that integrates well with "gate-last" MOS transistor fabrication. In this embodiment, MOS transistor 202 in bit cell 302 may fabricated concurrently with antifuse 201. Beginning with operation 403, first and second features of sacrificial material are patterned within a surrounding dielectric material. Referring to FIG. 5A, sacrificial material features 508 and 509 are embedded within dielectric material 209. Any process known in the art may be utilized to form sacrificial material features 508, 509 planarized with dielectric material 209. In an exemplary embodiment, sacrificial material features 508, 509 include a polycrystalline semiconductor, such as, but not limited to, polysilicon. In one particular polysilicon embodiment, sacrificial polysilicon material features 408, 409 have a thickness (z-height) less than 150 nm and advantageously no more than 100 nm. In further embodiments, sacrificial features may include a top hardmask disposed over the bulk sacrificial material. Dielectric material 209 may be any conventional material, such as but not limited to silicon dioxide and/or silicon nitride.

Figure 5B:
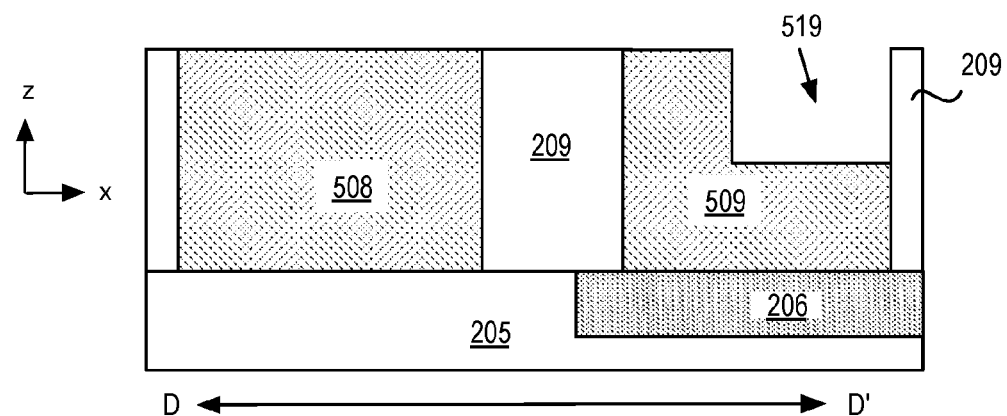

Returning to FIG. 4B, method 402 proceeds to operation 404 where a non-planar length of sacrificial material is formed over the substrate. In the exemplary embodiment, a first sacrificial feature is masked and only a portion of the second sacrificial feature is masked. The unmasked portion of the second sacrificial feature is then recessed below a top surface of the surrounding dielectric by an etch process performed at operation 405. As illustrated in FIG. 5B for example, a recess 519 is shown along a portion of sacrificial feature 509. Any masking process may be utilized at operation 404, such as, but not limited to a hardmask process. Operation 405 may include any etch process selective to the surrounding dielectric material, such as an anisotropic plasma (RIE) etch.

Figure 5C:
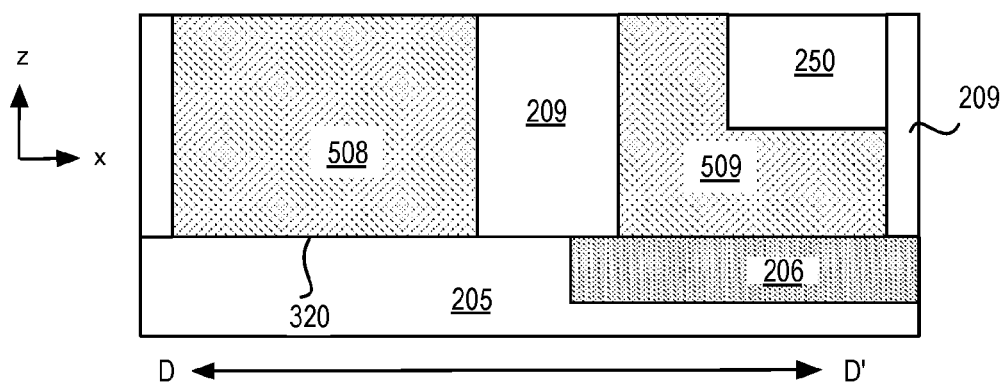
Figure 5D:
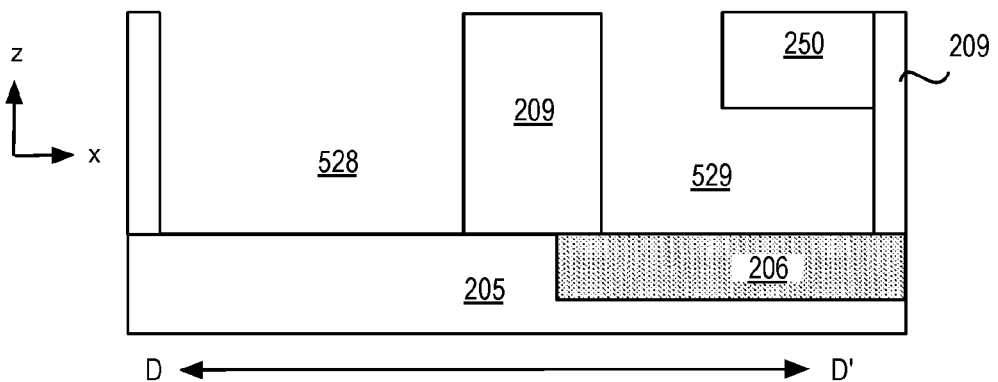
Figure 5E:
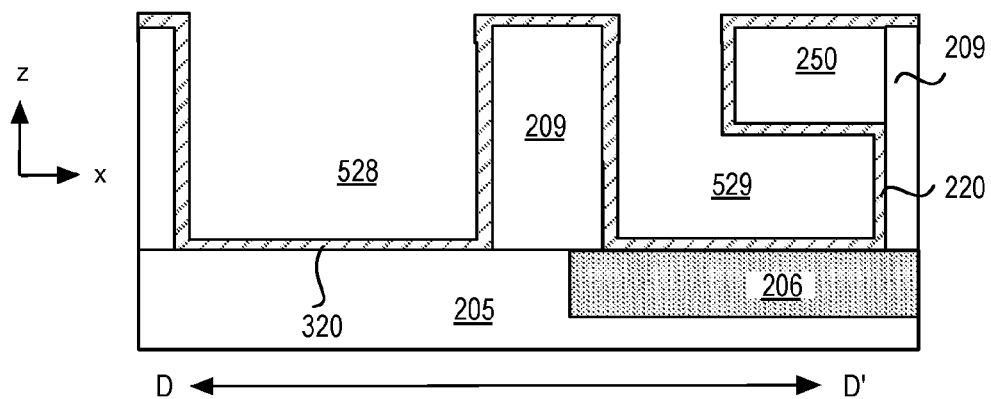

Returning to FIG. 4B, method 402 then proceeds to operation 406 where the recessed portion of the sacrificial feature is backfilled with another dielectric material. Any deposition (e.g., CVD, spin-on) and planarization process (e.g., CMP) may be utilized at operation 406. FIG. 5C illustrates one embodiment where dielectric material 250 is backfilled over a portion of sacrificial feature 509. Dielectric material 250 is again planarized with dielectric material 209 and sacrificial feature 508 (and with high-z portion of sacrificial feature 509).

Method 402 (FIG. 4B) continues with operation 407 where the first and second sacrificial features are removed selectively relative to the surrounding dielectric material including the dielectric material that was previously backfilled. In the exemplary embodiment illustrated in FIG. 5D, removal of sacrificial feature 508 leaves a first void 528 and removal of sacrificial feature 509 leaves a second void 529, which laterally undercuts dielectric material 250. Where the sacrificial material is polysilicon for example, a highly selective plasma etch and/or wet chemical etch may be utilized to completely clean out the sacrificial material even from below extensive dielectric overhangs. Precision patterning of the sacrificial material at operation 404 may be leveraged at operation 307 to tightly control dimensions of voids 528, 529.

With a first opening now formed through dielectric material 250, method 402 proceeds to operation 421 where a gate dielectric material is deposited into the first and second voids. Any suitable gate dielectric deposition process may be employed at operation 421. In an exemplary embodiment, a CVD and/or ALD process is employed at operation 421 to deposit a high-k gate dielectric material (e.g., having a bulk relative dielectric constant of at least 10). As shown in the exemplary embodiment illustrated by FIG. 5E, a gate dielectric deposition process is employed to both line the first void 528 with gate dielectric layer 320 and line the second void 529 with dielectric material 220. In other words, dielectric material 220 is also the "gate" dielectric material, but has a different functionality in the context of an antifuse.

Figure 5F:
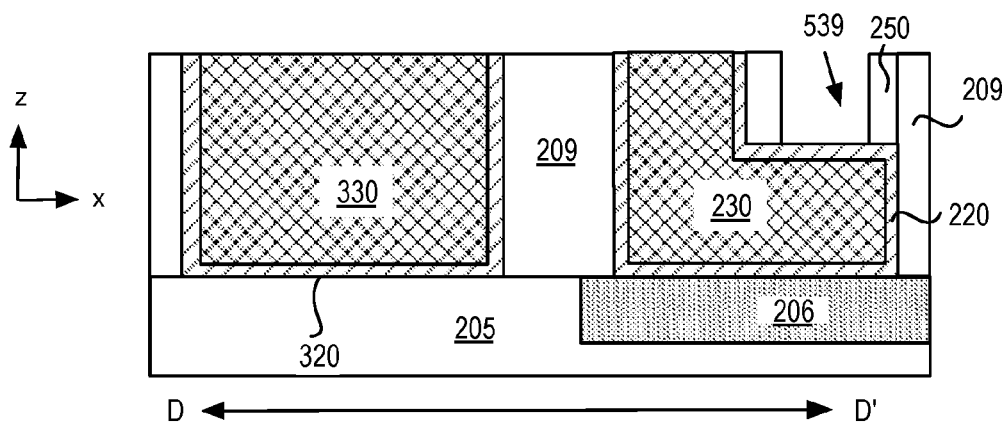

Returning to FIG. 4B, at operation 431, first and second voids are backfilled with conductive material to form a gate terminal in the first void and an isolated antifuse terminal in the second void. In advantageous embodiments, voids with overhangs may be backfilled with a highly conformal deposition process. A metal ALD process is utilized in one such embodiment. As shown in FIG. 5F for example, a metal ALD process backfills gate terminal 330 into void 528 concurrently with backfilling antifuse terminal 230 into void 529, completely filling any undercut region disposed below dielectric material 250.

Figure 5G:
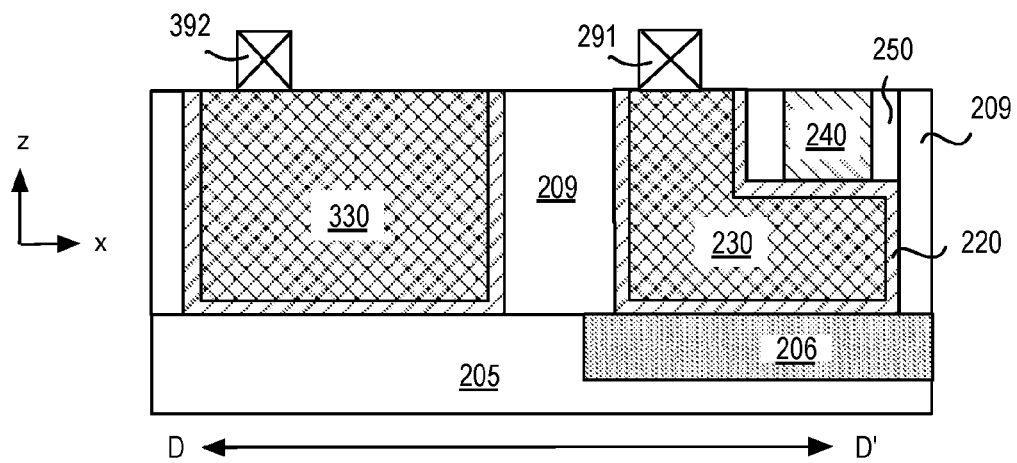

Method 402 then continues with forming the second opening through the overlying dielectric material to expose the underlying (gate) dielectric material. Any lithographic and/or etch process may be utilized to form the second opening at operation 441. In some embodiments, the etch process at operation 441 is highly selective to the underlying dielectric material ensuring etch stop before breaking through to the conductive terminal. In further embodiments, operation 441 may additionally include a deliberate thinning of the second dielectric material within the second opening. Such thinning may be controlled to some predetermined target thickness less than the thickness of the gate dielectric material. Method 402 then completes with forming the second antifuse terminal by filling the second opening with conductive material at operation 450. As shown in FIGS. 5F and 5G for example, opening 539 is etched over the low-z portion of antifuse terminal 230 and backfilled with conductive material 240. In one advantageous embodiment, conductive material 240 is deposited concurrently with deposition of source/drain contacts on opposite sides of gate terminal 330. Conventional fabrication may follow method 402 to complete an IC, for example forming interconnects 291, 392 to electrically connect a MOS transistor source/drain contact to an antifuse terminal.

Figure 6:
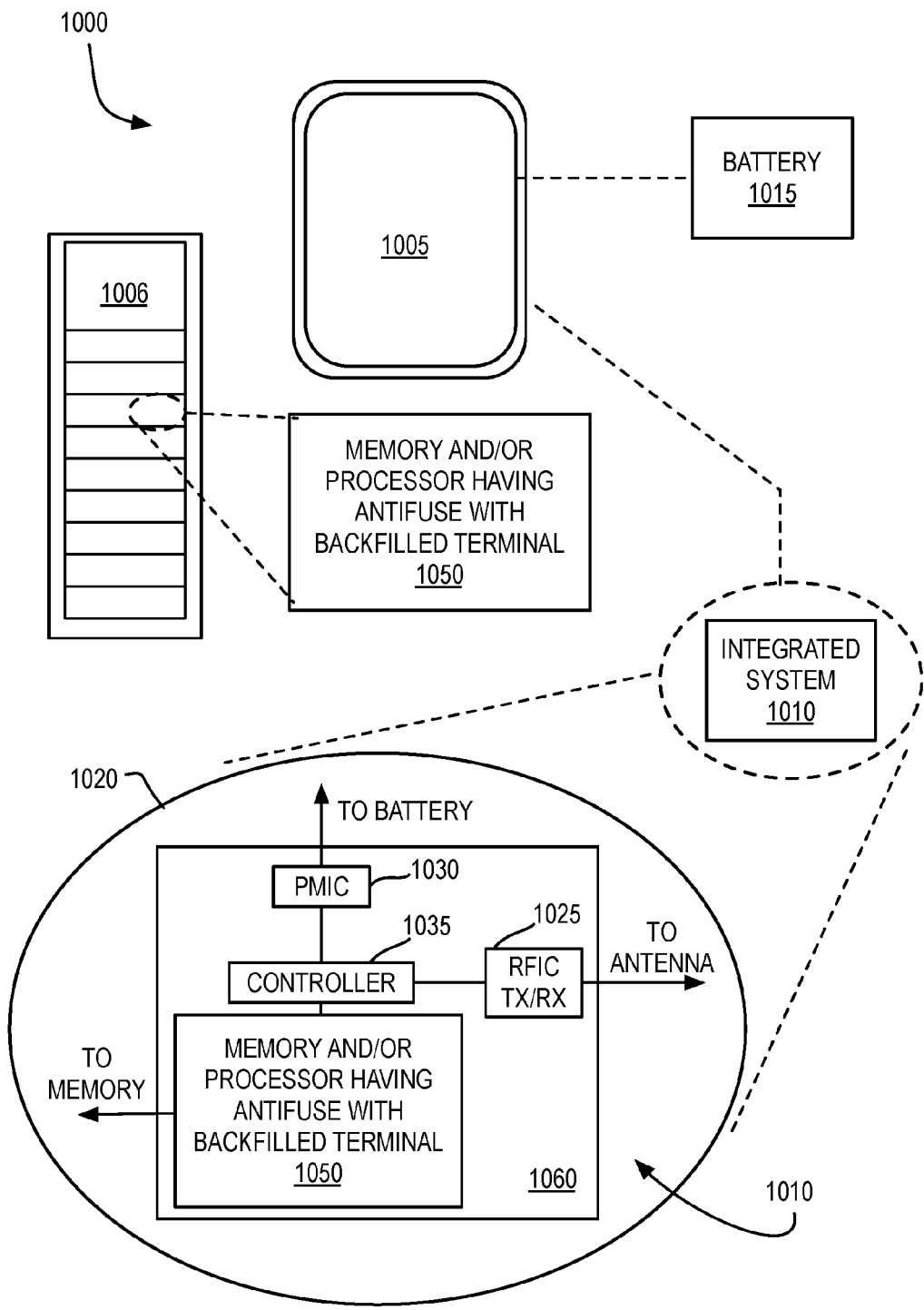
FIG. 6 illustrates a mobile computing platform and a data server machine employing a monolithic antifuse with a backfilled terminal in accordance with embodiments of the present invention.

FIG. 6 illustrates a system 1000 in which a mobile computing platform 1005 and/or a data server machine 1006 employs a monolithic antifuse with a backfilled terminal in accordance with embodiments of the present invention. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) employing a monolithic architecture with at least one antifuse with a backfilled terminal. Advantageously, integrated system 1010 includes an antifuse bit cell where the antifuse terminals comprise a transistor gate terminal metal and transistor contact metal separated by a transistor gate dielectric, for example as describe elsewhere herein. The monolithic IC 1050 may be further coupled to a board, a substrate, or an interposer 1060 along with, one or more of: a power management integrated circuit (PMIC) 1030; RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path); and a controller thereof 1035.

Functionally, PMIC 1030 may perform battery power regulation, DC-to-DC conversion, etc., and so has an input coupled to battery 1015 and with an output providing a current supply to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050.

Figure 7:
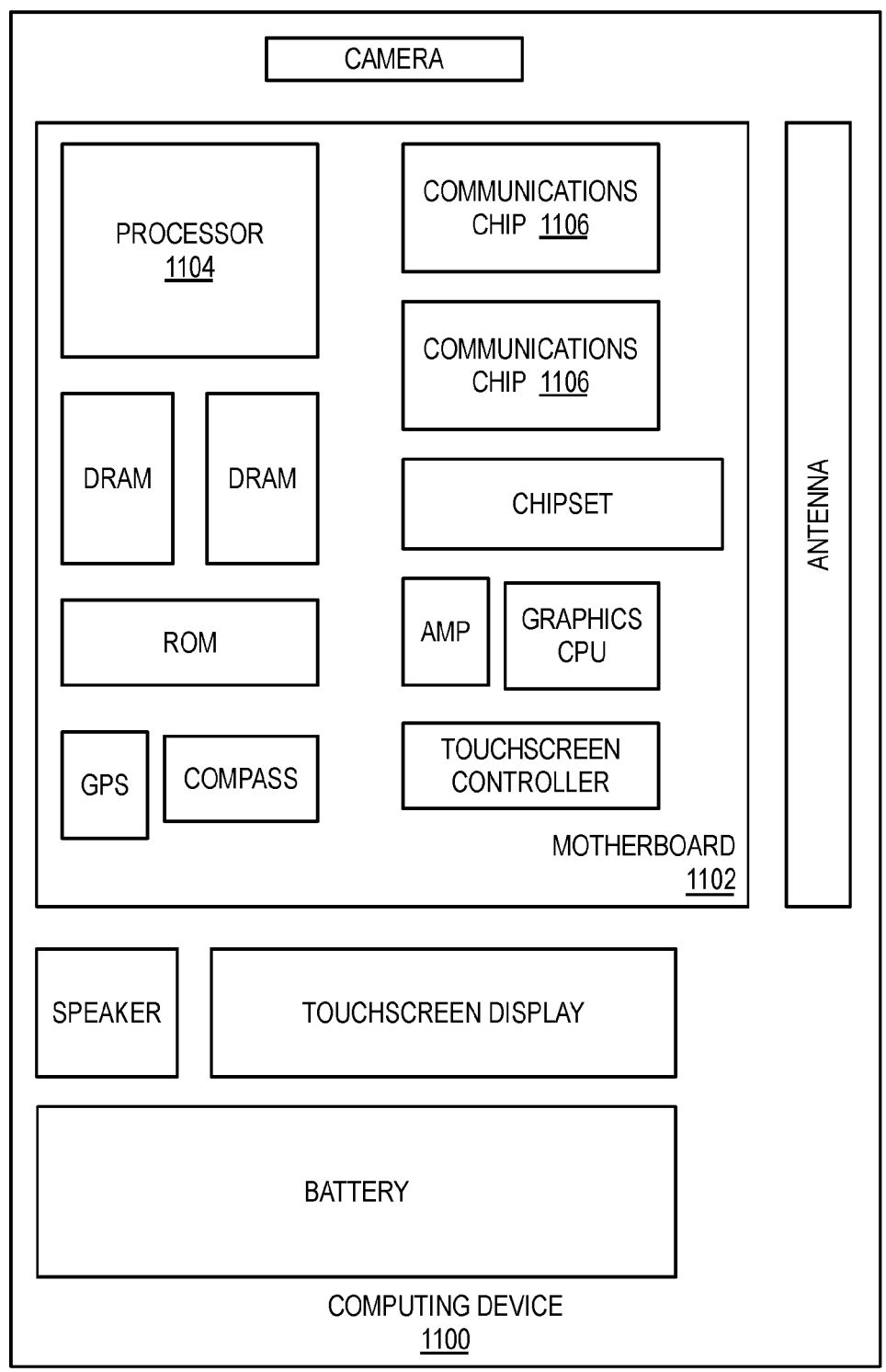
FIG. 7 is a functional block diagram of an electronic computing device, in accordance with an embodiment of the present invention.

FIG. 7 is a functional block diagram of a computing device 1100, arranged in accordance with at least some implementations of the present disclosure. Computing device 1100 may be found inside platform 1005 or server machine 1006, for example. Device 1100 further includes a motherboard 1102 hosting a number of components, such as but not limited to a processor 1104 (e.g., an applications processor), which may further incorporate an antifuse with a back filled terminal as discussed herein. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 1106. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. The above embodiments may include specific combination of features. For example:

In one or more first embodiments, a monolithic antifuse includes a non-planar conductive terminal disposed on a substrate. The non-planar terminal having a high-z portion extending to a greater z-height from the substrate than does a low-z portion. The antifuse includes a first dielectric material wrapping around at least one sidewall of the low-z portion. A second dielectric material is disposed over the first dielectric material and the low-z portion. A second conductive terminal is disposed over the low-z portion, extends through a least a partial thickness of the second dielectric material, and is separated from the first terminal by at least a partial thickness of the first dielectric material.

In furtherance of the one or more first embodiments, a top surface of the high-z portion is planer with a top surface of the second terminal. The first dielectric material wraps completely around sidewalls of the high-z portion extending above the low z-portion. The second dielectric material is disposed between the high-z portion of the first terminal and the second terminal.

In furtherance of the one or more first embodiments, the substrate comprises crystalline semiconductor. The first and second terminals comprises a metal. The first dielectric material is a high-k material having a bulk relative dielectric constant of at least 10 and a thickness less than 10 nm. The second dielectric material has a bulk relative dielectric constant below that of the first dielectric material.

In furtherance of the one or more first embodiments, the second terminal is separated from the non-planar terminal by only the first dielectric material. The first terminal has a transverse width along the low-z portion, and the second terminal comprises a filled via having a diameter larger than the transverse width of the first terminal.

In furtherance of the one or more first embodiments, the substrate comprises crystalline semiconductor. The non-planar terminal is separated from the crystalline semiconductor by only the first dielectric material and an isolation dielectric recessed into the crystalline semiconductor. The non-planar terminal has a first thickness within the high-z portion greater than a second thickness within the low-z portion.

In one or more second embodiments, a monolithic antifuse bit cell includes a MOS transistor with a gate terminal, including first metal, disposed over a first region of a substrate with a gate dielectric material disposed there between. The antifuse bit cell includes an antifuse with a first terminal, including the first metal, disposed over a second region of the substrate. A second antifuse terminal is disposed over the first antifuse terminal with an intervening dielectric material there between. The intervening dielectric material includes at least a partial thickness of the gate dielectric material.

In furtherance of the one or more second embodiments, the gate dielectric material has a first interface with the first antifuse terminal and a second interface with the second antifuse terminal.

In furtherance of the one or more second embodiments, the MOS transistor is coupled to the first antifuse terminal to control a voltage level between the first and second antifuse terminals. The first antifuse terminal has a high-z portion with a top surface that is planar with a top surface of the gate terminal. The first antifuse terminal has a low-z portion with the a gate dielectric material wrapping completely around at least the low-z portion and separating the first antifuse terminal from the second region of the substrate. A second dielectric material is disposed over the low-z portion. The second antifuse terminal extends through the second dielectric disposed over the gate dielectric material and the low-z portion of the first terminal to contact the gate dielectric material.

In furtherance of the one or more second embodiments, the gate terminal comprises a first stripe of the first metal disposed over the first substrate region. The first antifuse terminal comprises a second stripe of the first metal disposed over the second substrate region and adjacent to the first stripe. The second stripe has thick end with the same z-thickness as that of the first stripe, and a thin end having a z-thickness less than that of the first stripe. The second antifuse terminal is disposed over the thin end and has a top surface planar with a top surface of the first stripe.

In furtherance of the one or more second embodiments, the gate dielectric comprises a high-k gate dielectric material having a bulk relative dielectric constant of at least 10, and the intervening dielectric material includes at least a partial thickness of the high-k gate dielectric material.

In one or more third embodiments, a method of fabricating a monolithic antifuse includes forming a first opening in a first dielectric material disposed over a substrate, the first opening undercutting a region of the first dielectric material. The method includes lining the undercut region of the first dielectric material with a second dielectric material by depositing the second dielectric material through the first opening. The method includes forming a first terminal of the antifuse by backfilling the lined undercut region through the first opening with a conductive first terminal material. The method includes forming a second opening through the first dielectric material that exposes the first dielectric material lining the undercut region. The method includes forming a second terminal of the antifuse by backfilling the second opening with a conductive second terminal material.

In furtherance of the one or more third embodiments, forming the first opening further includes forming a non-planar length of sacrificial material over the substrate, the non-planar length having a high-z portion extending to a greater z-height from the substrate than does a low-z portion. Forming the first opening further includes depositing the first dielectric material over the non-planar length. Forming the first opening further includes planarizing the first dielectric material with the high-z portion. Forming the first opening further includes etching the sacrificial material selectively from the first dielectric material.

In furtherance of the one or more third embodiments, forming the first opening further includes forming a non-planar length of sacrificial material over the substrate, the non-planar length having a high-z portion extending to a greater z-height from the substrate than does a low-z portion. Forming the non-planar length of sacrificial material further includes depositing the sacrificial material to a uniform thickness equal to the greater z-height. Forming the non-planar length of sacrificial material further includes masking the high-z portion of the sacrificial material. Forming the non-planar length of sacrificial material further includes recessing the low-z portion of the sacrificial material to a lesser thickness. Forming the non-planar length of sacrificial material further includes backfilling the low-z portion with the first dielectric material. Forming the non-planar length of sacrificial material further includes etching the sacrificial material selectively from the first dielectric material.

In furtherance of the one or more third embodiments, forming the first opening further includes forming a non-planar length of sacrificial material over the substrate, the non-planar length having a high-z portion extending to a greater z-height from the substrate than does a low-z portion. Forming the non-planar length of sacrificial material further includes patterning an opening in an isolation dielectric. Forming the non-planar length of sacrificial material further includes patterning an opening in either the sacrificial material layer or a surrounding dielectric material, backfilling the opening in the surrounding dielectric material with the sacrificial material or backfilling the opening in the sacrificial material with the surrounding dielectric material. Forming the non-planar length of sacrificial material further includes masking the high-z portion of the sacrificial material. Forming the non-planar length of sacrificial material further includes recessing the unmasked sacrificial material below a top surface of the isolation dielectric to form the low-z portion. Forming the non-planar length of sacrificial material further includes backfilling the low-z portion with the first dielectric material. Forming the non-planar length of sacrificial material further includes etching the sacrificial material selectively from the first dielectric material.

In furtherance of the one or more third embodiments, a second feature of the sacrificial material is also formed over the substrate, with a first dielectric material between the first and second features. The second feature is masked (completely) while masking the high-z portions of the first feature. The second sacrificial material feature is removed along with the first feature. The second dielectric material is also deposited into a second void resulting from removing the second sacrificial material. Along with the embedded fuse terminals, a gate terminal is formed by backfilling the second void with the conductive material.

In furtherance of the one or more third embodiments, lining the undercut region of the first dielectric material with the second dielectric material further includes depositing, with a chemical vapor deposition (CVD) or atomic layer deposition (ALD) process, a high-k dielectric material having a bulk relative dielectric constant of at least 10, and backfilling the lined undercut region through the first opening with a conductive first terminal material further comprises depositing a metal with an ALD process.

In one or more fourth embodiments, a method of forming a monolithic antifuse bit cell includes forming a first feature of sacrificial material over a first region of a substrate and a second feature of sacrificial material over a second region of the substrate, with an isolation dielectric material there between. The method includes masking the first feature and a first portion of the second feature. The method includes recessing an unmasked portion of the second feature below a top surface of the isolation dielectric. The method includes backfilling the recessed portion of the second feature with a first dielectric material. The method includes removing the first and second sacrificial material features selectively from the isolation dielectric material and the first dielectric material. The method includes depositing a gate dielectric material into first and second voids left from removing the first and second features. The method includes backfilling the first and second voids with a conductive material to form one gate terminal over the first substrate region and a first antifuse terminal over the second substrate region. The method includes forming an opening through the first dielectric material to expose the gate dielectric material. The method includes forming a second antifuse terminal by filling the opening with a conductive material.

In furtherance of the one or more fourth embodiments, the method includes removing the second sacrificial material feature undercuts the first dielectric material. The method includes depositing the gate dielectric material lines the undercut. The method includes backfilling the voids with the conductive material fills the undercut.

In furtherance of the one or more fourth embodiments, the method includes depositing the gate dielectric material further comprises depositing, with a chemical vapor deposition (CVD) or atomic layer deposition (ALD) process, a high-k dielectric material having a bulk relative dielectric constant of at least 10, and backfilling the voids further comprises depositing a metal with an ALD process.

In furtherance of the one or more fourth embodiments, the method includes forming first second source/drain contacts on opposite sides of the gate terminal; and electrically connecting one of the source/drain contacts to an antifuse terminal.

In furtherance of the one or more fourth embodiments, recessing the unmasked portion of the second feature below a top surface of the isolation dielectric further includes etching a partial thickness of the sacrificial material.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:
1. An antifuse structure, comprising:
   a non-planar conductive terminal over a substrate, the non-planar terminal having a high-z portion and a low-z portion, wherein the high-z portion extends to a greater z-height from the substrate than does the low-z portion;
   a first dielectric material wrapping around at least one sidewall of the low-z portion and completely around sidewalls of the high-z portion; and
   a second conductive terminal over the low-z portion and extending through a least a partial thickness of a second dielectric material that is between the high-z portion of the non-planar terminal and the second terminal, wherein the second conductive terminal is separated from the low-z portion of the non-planar terminal by at least a partial thickness of the first dielectric material, and wherein the first dielectric material is a high-k material, and the second dielectric material has a dielectric constant below that of the first dielectric material.
2. The antifuse structure of claim 1, wherein a top surface of the high-z portion is planer with a top surface of the second terminal.
3. The antifuse structure of claim 1, wherein:
   the substrate comprises crystalline semiconductor;
   the non-planar terminal and second terminal comprise a metal;
   the first dielectric material is a high-k material having a bulk relative dielectric constant of at least 10 and a thickness less than 10 nm; and
   the second dielectric material has a bulk relative dielectric constant below that of the first dielectric material.
4. The antifuse structure of claim 1, wherein:
   the second terminal is separated from the non-planar terminal by only the first dielectric material;
   the non-planar terminal has a transverse width along the low-z portion; and
   the second terminal comprises a filled via having a diameter larger than the transverse width of the non-planar terminal.
5. The antifuse structure of claim 1, wherein:
   the substrate comprises crystalline semiconductor;
   the non-planar terminal is separated from the crystalline semiconductor by only the first dielectric material and an isolation dielectric recessed into the crystalline semiconductor;

the non-planar terminal has a first thickness within the high-z portion greater than a second thickness within the low-z portion.

6. An antifuse bit cell structure, comprising:
a MOS transistor with a gate terminal including a first metal over a first region of a semiconductor substrate with a gate dielectric material therebetween; and
an antifuse with a first terminal, including the first metal, over a second region of the substrate, and a second terminal disposed over the first terminal with an intervening dielectric material therebetween, wherein the intervening dielectric material includes at least a partial thickness of the gate dielectric material.

7. The antifuse bit cell structure of claim 6, wherein the gate dielectric material has a first interface with the first antifuse terminal and a second interface with the second antifuse terminal.

8. The antifuse bit cell structure of claim 6, wherein:
the MOS transistor is coupled to the first terminal to control a voltage level between the first and second terminals;
the first terminal has a high-z portion with a top surface that is planar with a top surface of the gate terminal;
the first terminal has a low-z portion with the gate dielectric material wrapping completely around at least the low-z portion and separating the first terminal from the second region of the substrate; and
the second terminal extends through a second dielectric material over the gate dielectric material and the low-z portion of the first terminal to contact the gate dielectric material.

9. The antifuse bit cell structure of claim 6, wherein:
the gate terminal comprises a first stripe of the first metal over the first substrate region;
the first terminal comprises a second stripe of the first metal over the second substrate region and adjacent to the first stripe;
the second stripe has thick end with the same z-thickness as that of the first stripe, and a thin end having a z-thickness less than that of the first stripe;
the second terminal is over the thin end and has a top surface planar with a top surface of the first stripe.

10. The antifuse bit cell structure of claim 6, wherein the gate dielectric comprises a high-k gate dielectric material having a bulk relative dielectric constant of at least 10, and the intervening dielectric material includes at least a partial thickness of the high-k material.

11. The antifuse structure of claim 1, wherein the first terminal has a transverse width along the low-z portion, and the second terminal comprises a filled via having a diameter larger than the transverse width of the first terminal.

12. The antifuse structure of claim 1, wherein the first dielectric material wraps completely around the low z-portion.

13. The antifuse structure of claim 1, wherein the non-planar terminal is separated from the substrate by the first dielectric material.

14. An antifuse structure, comprising:
a non-planar conductive terminal over a substrate, the non-planar terminal having a high-z portion and a low-z portion, wherein the high-z portion extends to a greater z-height from the substrate than does the low-z portion;
a first dielectric material wrapping around at least one sidewall of the low-z portion; and
a second conductive terminal over the low-z portion and extending through at least a partial thickness of a second dielectric material that is between the high-z portion of the non-planar terminal and the second conductive terminal, wherein:
the second conductive terminal is separated from the low-z portion of the non-planar terminal by only the first dielectric material;
the non-planar terminal has a transverse width along the low-z portion; and
the second conductive terminal comprises a filled via having a diameter larger than the transverse width of the non-planar terminal;
the first dielectric material is a high-k material; and
the second dielectric material has a dielectric constant below that of the first dielectric material.

15. The antifuse structure of claim 14, wherein the first dielectric material is completely around sidewalls of the high-z portion.

16. The antifuse structure of claim 14, wherein the first dielectric material wraps completely around the low z-portion.

* * * * *